United States Patent

[11] 3,616,406

[72] Inventor Paul A. Turner
Murray Hill, N.J.
[21] Appl. No. 873,446
[22] Filed Nov. 3, 1969
[45] Patented Oct. 26, 1971
[73] Assignee Bell Telephone Laboratories Inc.
Murray Hill, N.J.

[54] PREPARATION OF GLUE LAYER FOR BONDING GOLD TO A SUBSTRATE
4 Claims, 2 Drawing Figs.

[52] U.S. Cl. .......... 204/192, 317/234 L, 317/234 M, 75/165
[51] Int. Cl. .......... C23c 15/00
[50] Field of Search .......... 204/192; 317/234 (5.2)

[56] References Cited
UNITED STATES PATENTS

| | | | |
|---|---|---|---|
| 3,241,931 | 3/1966 | Triggs et al. | 317/234 (5.3) |
| 3,294,661 | 12/1966 | Maissel | 204/192 |
| 3,324,019 | 6/1967 | Laegreid et al. | 204/192 |
| 3,477,935 | 11/1969 | Hall | 204/192 |
| 3,515,663 | 6/1970 | Bodway | 204/192 |

*Primary Examiner*—John H. Mack
*Assistant Examiner*—Sidney S. Kanter
*Attorneys*—R. J. Guenther and Edwin B. Cave

ABSTRACT: A technique for preparing a glue layer destined for use in bonding gold to a substrate involves depositing a gold-transition metal alloy upon a substrate member by cathodic sputtering techniques.

INVENTOR
P.A. TURNER
BY Edward M. Fink
ATTORNEY

PREPARATION OF GLUE LAYER FOR BONDING GOLD TO A SUBSTRATE

BACKGROUND OF THE INVENTION

1. Field of the Invention

This invention relates to a technique for the preparation of a glue layer destined for use in the fabrication of thin film circuits. More particularly, the present invention relates to a technique for the preparation of a glue layer suitable for bonding gold to a substrate.

2. Description of the Prior Art

In the fabrication of thin film circuits, it has been the practice of many workers in the art to employ gold as the interconnection material between components of the circuit. This selection is predicated primarily upon the fact that gold manifests superior oxidation resistance and is ideally suited for beam lead and thermocompression bonding techniques. However, gold does not readily adhere to the glass and ceramic substrates ordinarily employed in the manufacture of such circuits. Accordingly, the need for a satisfactory glue layer for bonding gold to the substrates of interest has long been recognized.

Heretofore, this end has been attained by depositing a thin film of an active metal such as titanium, chromium or Nichrome upon the substrate surface prior to the deposition of the gold, the active metal serving as the glue layer. Unfortunately, this approach has not proven to be entirely satisfactory in that during the lifetime of the circuit several adverse effects occur. More specifically, it has been found that the active metal interdiffuses into the gold, so resulting in a degradation of the conductivity of the gold and the concomitant degradation in adhesion of the glue layer to the substrate. Additionally, pin holes in the gold layer permit access to the active metal by gaseous materials which lead to corrosion effects in the galvanic cell formed at the gold-active metal interface.

SUMMARY OF THE INVENTION

In accordance with the present invention, these prior art limitations are effectively minimized by utilizing a glue layer comprising a gold-transition metal alloy. Briefly, the subject invention involves depositing a gold-transition metal alloy upon a selected substrate by sputtering techniques prior to deposition of the gold interconnection material thereon, the transition metal being selected from among vanadium and chromium. The resultant glue layers have been found to result in a circuit manifesting lower conductivity degradation and lower adhesion losses in the gold interconnection material than that evidenced by any of the prior art circuits.

BRIEF DESCRIPTION OF THE DRAWING

The invention will be more readily understood by reference to the following detailed description taken in conjunction with the accompanying drawing, wherein.

DETAILED DESCRIPTION

For purposes of exposition, the present invention has been described largely in terms of getter sputtering. However, it will be appreciated by those skilled in the art that such description is merely illustrative in nature rather than limiting and any sputtering procedure and set of known operating parameters may be employed (see "Vacuum Deposition of Thin Films," L. Holland, J. Wiley & Sons, Inc., New York, 1956).

Figure 1:
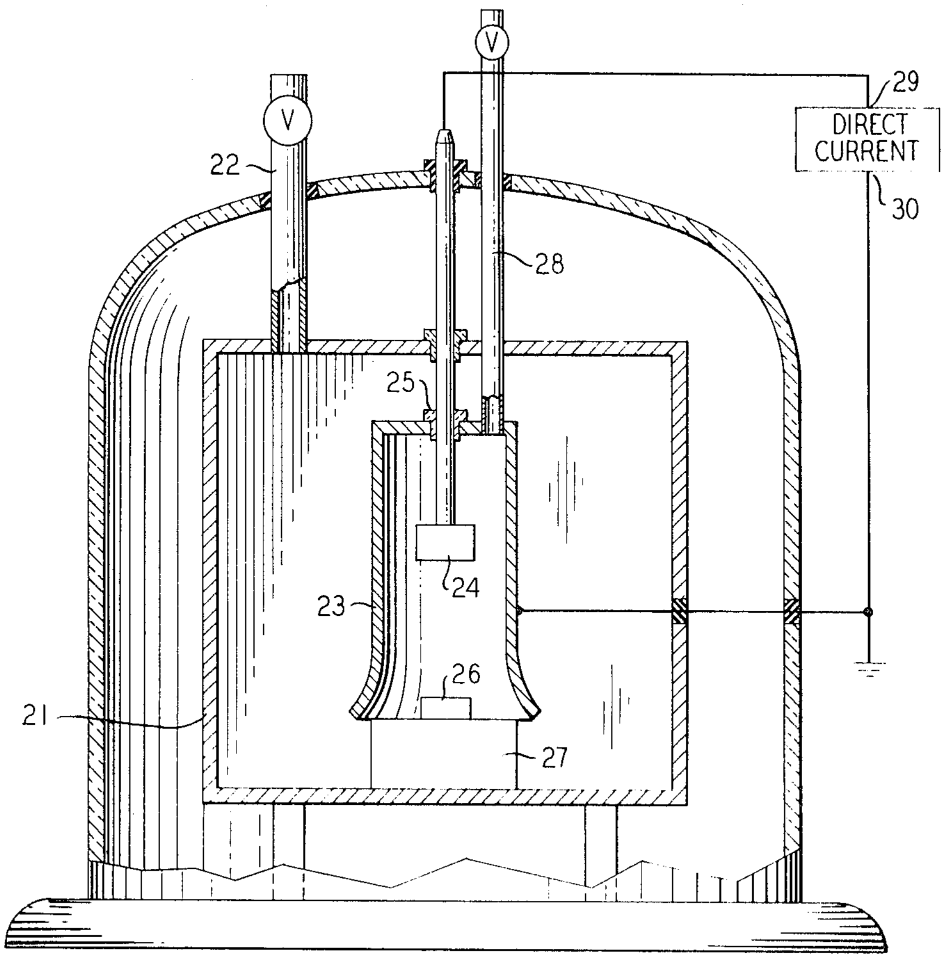
FIG. 1 is a front elevational view of an apparatus suitable for depositing the glue layers of the invention.

With reference now to FIG. 1 there is shown a typical apparatus suitable for sputtering glue layers in accordance with the present invention. Shown in the Figure is vacuum chamber 21 provided with an outlet 22 for connection to a vacuum pump (not shown). Shown disposed within chamber 21 is an anode member 23 which defines a space gradient in an area substantially surrounding cathode 24 which is supported thereby and electrically insulated therefrom by insulator 25. Cathode 24 is comprised of the gold-transition metal alloy which is required to be deposited upon substrate or workpiece 26 supported on work table 27, workpiece 26 being situated at a point opposite cathode 24 within the noted space gradient. Inlet 28 is provided for introducing an inert gas into the volume defined by the intercept of the plane of said cathode and said space gradient. Cathode 24 is connected to the negative pole 29 of a direct current high voltage supply, the positive pole of which is connected as at 30 to anode 23 and to ground.

As indicated, the cathode selected for use in preparing the glue layer of interest is an alloy of gold and vanadium or chromium.

The alloys employed herein are gold rich alloys containing from 10 to 20 percent by weight of the active metal element when said element is vanadium and from 10 to 25 percent by weight when said element is chromium, such range being found to avoid the formation of intermediate phases which occur after the deposition of an overlying gold layer and adhesion deficiencies. Studies have revealed that the use of less than 10 percent by weight of active metal fails to provide the required degree of adhesion for the overlying gold layer, whereas alloys containing greater than the noted maxima, by weight, of active metal element tend to lead to the formation of the deleterious intermediate phases, such being attributed to diffusion phenomena.

The active or transition metal elements found suitable in the practice of the present invention are chromium and vanadium. The alloys of interest are obtained in accordance with any known metallurgical preparative technique.

The present invention may conveniently be described in detail by reference to an illustrative example in which a gold-transition metal alloy is employed as the cathode in an apparatus similar to that shown in FIG. 1.

Initially, the vacuum chamber is evacuated and a partial pressure of a nonoxidizing or nonreactive has as for example hydrogen or any of the members of the rare gas family such as helium, argon or neon introduced into the chamber. After the required pressure is attained, cathode 24 is made electrically negative with respect to anode 23. By employing a proper voltage, pressure and spacing of the various elements within the vacuum chamber, such being well known to those skilled in the art, a layer of gold-transition metal alloy is deposited upon substrate 26. Sputtering is conducted for a period of time calculated to produce the desired thickness of glue layer which for the purposes of the present invention ranges from 500 to 1,000 A. The thickness of this layer is not considered critical and no advantage is realized by the use of films in excess of 1,000 A. The lower limit of 500 A is dictated solely by practical considerations. In the cathodic sputtering process the substrate surface may be heated to temperatures ranging up to 400° C.

Figure 2:
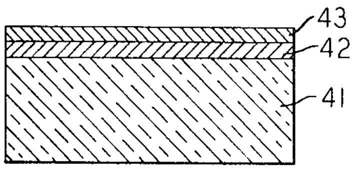
FIG. 2 is a front elevational view in cross section of a substrate bearing a gold-transition metal alloy glue layer prepared in accordance with the present invention.

The structure resulting from the process described previously is shown in FIG. 2 in cross-sectional view. Shown in the Figure is substrate 41 bearing a layer 42 of a sputtered gold-transition metal alloy. Also shown in the Figure is a layer of gold 43 deposited upon the glue layer subsequent to sputtering for the purpose of defining a structure suitable for use in thin film circuit applications.

Returning again to a discussion of the illustrative example, the deposition of the glue layer of interest is followed by a series of tests designed to determine adhesion characteristics.

Examples of the present invention are described in detail below. These examples are included merely to aid in the understanding of the invention and variations may be made by one skilled in the art without departing from the spirit and scope of the invention.

EXAMPLE I

A cathodic sputtering apparatus similar to that shown in FIG. 1 was employed wherein a Au-25% Cr, 1 inch in diameter, prepared by alloying gold with chromium was used as the cathode. The anode used included an enveloping nickel can opened at one end. The substrate was a 1inch ×3 inches glass microscope slide cleansed by degreasing with isopropyl alcohol. The system was initially evacuated by pumping to a pressure of $10^{17}$ torr. In order to condition the system, purified argon maintained at a pressure of 70 microns was introduced into the system and sputtering initiated upon a shutter by applying 1,500 volts to the electrode. Sputtering was continued for 30 minutes to bring the target to steady state. Following, the shutter was removed and sputtering continued for 10 minutes, so yielding a layer of Au-25% Cr, 500 A. in thickness. Coating was terminated by closing the sputtering shield and turning off the sputtering voltage. The procedure was then repeated 19 times.

An adhesion scratch test was then conducted on the deposited films utilizing a pneumatically loaded tungsten carbide stylus. The stylus was pressed into the film and the substrate translated under it with increasing load until the stylus removed the film from the substrate surface. It was determined that this occurred after the application of between 670 and 870 grams on the stylus. For comparative purposes, the scratch test was run on 20 500 A thick gold films deposited on a glass substrate. A load within the range of 50 to 100 grams removed these films.

EXAMPLE II

The procedure of example I was repeated in employing Au-20% V as cathode. A load ranging from 620 to 660 grams was required to remove the films during the operation of the scratch test.

Conductivity measurements on annealing the two element thin film composites follow the behavior of the bulk metal elements. Accordingly, conductivity degradation for the structures described in examples I and II is less than that for structures including the pure element as the glue layer since less active metal is employed.

It will be appreciated by those skilled in the art that although the present invention has been described in terms of gold-chromium and gold-vanadium alloys, other transition metals could efficaciously serve as the active metal.

I claim:

1. A technique for bonding gold to a substrate which comprises depositing a thin film of a gold-transition metal alloy upon a substrate, said alloy being selected from the group consisting of gold-chromium comprising 10to 25percent by weight of chromium and gold-vanadium comprising 10to 20percent by weight of vanadium, and depositing a layer of gold on said alloy.

2. A technique in accordance with the procedure of claim 1 wherein said alloy is deposited by cathodic sputtering techniques.

3. A method in accordance with the procedure of claim 1 wherein said alloy has a thickness of at least 500 A.

4. A method in accordance with the procedure of claim 1 wherein the substrate is glass substrate.

* * * * *